United States Patent [19]

Voigt et al.

[11] Patent Number: 4,572,597
[45] Date of Patent: Feb. 25, 1986

[54] COVER FOR RACK CABINETS, PARTICULARLY FOR DATA PROCESSING EQUIPMENT

[75] Inventors: Ulrich Voigt, Munich; Leopold Hör, Augsburg; Werner Stoebrich, Biberbach, all of Fed. Rep. of Germany

[73] Assignee: Siemens Aktiengesellschaft, Berlin & Munich, Fed. Rep. of Germany

[21] Appl. No.: 584,895

[22] Filed: Feb. 29, 1984

[30] Foreign Application Priority Data

Mar. 22, 1983 [DE] Fed. Rep. of Germany ... 8308487[U]

[51] Int. Cl.[4] ............................................ A47B 47/03
[52] U.S. Cl. .......................... 312/257 SK; 312/257 A
[58] Field of Search ........ 312/257 A, 257 SK, 257 R, 312/116; 226/340, 4 F, 83, 84

[56] References Cited

U.S. PATENT DOCUMENTS

| 3,736,035 | 5/1973 | Brown et al. | 312/257 SK |
| 3,856,371 | 12/1974 | Forsyth | 312/257 R |
| 3,974,934 | 8/1976 | Rohner | 220/4 F |
| 4,153,313 | 5/1979 | Propst | 312/257 A |
| 4,232,920 | 11/1980 | Bukaitz | 312/257 R |
| 4,433,788 | 2/1984 | Erlam et al. | 312/257 SK |

Primary Examiner—William E. Lyddane
Assistant Examiner—Joseph Falk
Attorney, Agent, or Firm—Hill, Van Santen, Steadman & Simpson

[57] ABSTRACT

A planar cover for rack or upright cabinets having a quadrangular hollow tube frame has flanges at three of its sides, and is rounded at its front side and provided with a flange at the rounded end. An angle element opened toward the panel cover is provided and does not terminate flush with the flange and is secured thereto, whereby a spring promoting the shielding effect is disposed between that leg of the angular flange which extends parallel to the cover wall after assembly and the appertaining quadrangular capping piece.

8 Claims, 3 Drawing Figures

COVER FOR RACK CABINETS, PARTICULARLY FOR DATA PROCESSING EQUIPMENT

BACKGROUND OF THE INVENTION

1. Field of the Invention

The present invention relates to a planar cover for rack or upright cabinets which have a quadrangular hollow tube frame, the cover being provided with flanges at three of its sides.

2. Description of the Prior Art

In data technology, rack or upright cabinets are employed for receiving and housing electrical components, the cabinets generally comprising a quadrangular hollow tube frame that is provided with covers on all sides, whereby the two or lateral covers, in particular, are usually designed as mirror images with respect to one another.

SUMMARY OF THE INVENTION

The object of the present invention is to provide the lateral covers of devices, particularly devices for remote data processing, with panels that provide simultaneous functions such as high-frequency (HF) shielding and outer paneling.

In order to achieve the above object, the cover of the present invention is designed such that its front side is rounded and provided with a flange at the rounded end, and an angled element opened toward the round section and not terminating flush with the flange; and such that an additional shielding element is eliminated between the leg of the angle part extending parallel to the panel side of the device after assembly and the appertaining quadrangular capping element.

As a result of the above structure, one obtains a lateral cover that is very easy to manufacture with low manufacturing costs.

It is thereby advantageous to employ an arcuate spring as the shielding element.

In accordance with a further feature of the invention, the cover can also be designed such that at least one side, preferably the lower side is twice flanged, multiply slotted and slightly prestressed towards the top at the distance of the outer dimensions of the upper and lower quadrangular hollow tubes. A cover designed in such a manner is particularly suited for higher requirements with respect to HF shielding.

BRIEF DESCRIPTION OF THE DRAWING

Other objects, features and advantages of the invention, will be best understood from the following detailed description, taken in conjunction with the accompanying drawing, on which.

DESCRIPTION OF THE PREFERRED EMBODIMENTS

Figure 1:
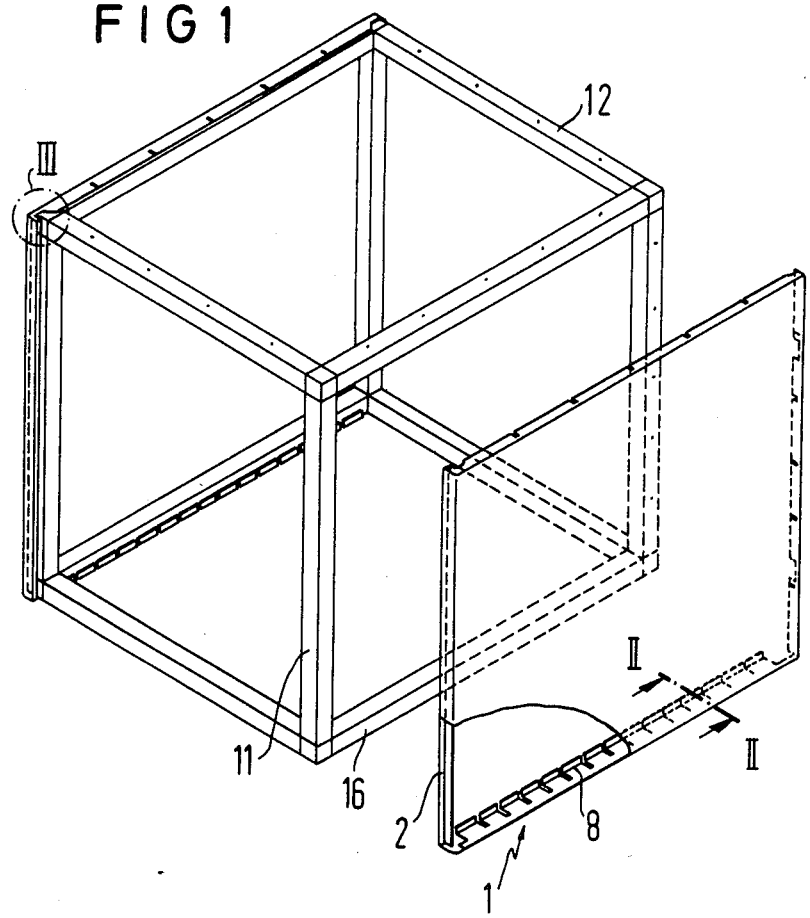
FIG. 1 is a perspective view of a hollow tube frame, whereby one lateral cover is applied to one side and is removed from the other side.

FIG. 1 illustrates a hollow tube frame that is the core component of a rack or upright cabinet, such as is employed for data processing equipment. The frame comprises bonded or screwed quadrangular hollow tubes. Mirror-image, identical covers 1 are applied to the two lateral sides, whereas the front side and the rear side are provided with different covers. The cover at the front side has been omitted from the drawing for the sake of simplicity, as has the rear cover. The front cover essentially comprises a mounting plate and a cover located over the mounting plate.

The lateral cover 1 is designed such that it is rounded at its front side and is provided with a flange 3 over its entire vertical length such that its open side is directed toward the rounding such that, moreover, it does not terminate flush with the flange. Between the further flange 9 and fastening tabs 14 carried by a mounting plate 15, which lie against the vertically-extending quadrangular hollow tubes 11, a spring 13 is provided with a convexly-extending arc and is bonded to a free leg 10 of the element 9 with its flat side so that, given an attached cover, it is clamped between the vertically-extending covering cap and the cover and thus produces both the mechanical tension for the cover and the shielding effect.

Figure 2:
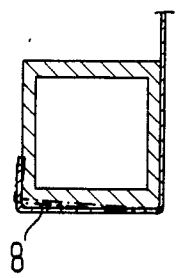
FIG. 2 is a sectional view taken generally along the line II—II of FIG. 1, but showing the cover mounted on the lower hollow tube.
Figure 3:
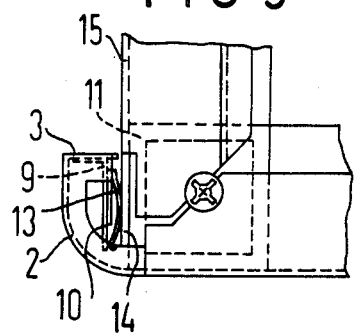
FIG. 3 is a fragmentary upper plan view of a portion of FIG. 1, illustrating in reverse as would apply to the opposite side of the frame.

The covers are provided with flanges at the remaining three sides thereof, whereby the flanges are twice constructed at the lower side at the interval of the outside dimension or spacing of the lower hollow tube with respect to the upper hollow tube. The flange 8 is multiply slotted so that a resilient effect arises. The slotted portions are slightly prestressed toward the top, as illustrated in FIG. 2. This resilient flanging, which need not be limited to only one side, effects an additional HF-type closure so that even higher shielding requirements can be met with this design. In a plan view, FIG. 3 illustrates further details of the structure of FIG. 1. It is readily apparent that the front mounting plate 15 carries a plurality of tabs 14. In order to mount the lateral cover 1, the lower edge is resilient slung, the cover is inserted over the horizontally-extending capping tubes 16 of the hollow tube frame and is screwed to the upper part and to the lower flange. The springs 13 between the front flange and the hollow tube frame also serve for tolerance compensation, in addition to the HF shielding.

In order to compensate manufacturing tolerances, in addition, simple shielding elements such as electrically-conductive cords or wire can also be employed at the corners. The device need not be manufactured of closed profiles, but can also consist of open profiles or even of self-bearing construction consisting of metal or plastic.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A cover for a rack-type cabinet, which cabinet comprises a frame comprising upper, lower, front and rear hollow tubes and a mounting plate carrying a plurality of aligned tabs extending along the front hollow tube, said cover comprising:
   a cover panel including first, second, third and fourth sides;
   said second, third and fourth sides each including a respective flange structure projecting generally perpendicular from said panel for frictionally engaging over said upper, lower and rear hollow tubes, respectively;

said first side comprising a rounded section comprising a distal end, and an angle-shaped flange carried by said distal end and including a first leg extending generally parallel to said cover panel and a second leg extending from said first leg towards and generally perpendicular to said cover panel; and an electrostatic shield element carried by said second leg for frictionally engaging the plurality of tabs.

2. The cover of claim 1, wherein:
said electrostatic shield element comprises an arcuate spring.

3. The cover of claim 1, wherein:
said flange structure of at least one of said second, third and fourth sides includes a lip extending parallel to said cover panel for engaging over the respective hollow tube.

4. The cover of claim 3, wherein:
said flange structure is multiply slotted and slightly prestressed to increase the engagement with the respective hollow tube.

5. A cover for a rack-type cabinet, which cabinet comprises a frame comprising upper, lower, front and rear frame members and a mounting plate carrying a plurality of aligned tabs extending along the front frame member, said cover comprising:

a cover panel including first, second, third and fourth sides;

said second, third and fourth sides each including a respective flange structure projecting generally perpendicular from said panel for frictionally engaging over said upper, lower and rear frame members, respectively;

said first side comprising a rounded section comprising a distal end, and an angle-shaped flange carried by said distal end and including a first leg extending generally parallel to said cover panel and a second leg extending from said first leg towards and generally perpendicular to said cover panel; and an electrostatic shield element carried by said second leg for frictionally engaging the plurality of tabs.

6. The cover of claim 5, wherein:
said electrostatic shield element comprises an arcuate spring.

7. The cover of claim 5, wherein:
said flange structure of at least one of said second, third and fourth sides includes a lip extending parallel to said cover panel for engaging over the respective frame member.

8. The cover of claim 5, wherein:
said flange structure is multiply slotted and slightly prestressed to increase the engagement with the respective frame member.

* * * * *